(12) United States Patent
Kay et al.

(10) Patent No.: US 12,255,630 B2
(45) Date of Patent: *Mar. 18, 2025

(54) TRANSVERSELY-EXCITED FILM BULK ACOUSTIC RESONATOR WITH OXIDE STRIP ACOUSTIC CONFINEMENT STRUCTURES

(71) Applicant: Murata Manufacturing Co., Ltd., Nagaokakyo (JP)

(72) Inventors: Andrew Kay, Provo, UT (US); Sean McHugh, Santa Barbara, CA (US); John Koulakis, Los Angeles, CA (US); Albert Cardona, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 313 days.

This patent is subject to a terminal disclaimer.

(21) Appl. No.: 17/719,311

(22) Filed: Apr. 12, 2022

(65) Prior Publication Data

US 2022/0360251 A1 Nov. 10, 2022

Related U.S. Application Data

(63) Continuation-in-part of application No. 17/555,353, filed on Dec. 17, 2021, which is a
(Continued)

(51) Int. Cl.
*H03H 9/56* (2006.01)
*H03H 3/02* (2006.01)
(Continued)

(52) U.S. Cl.
CPC ............. *H03H 9/568* (2013.01); *H03H 3/02* (2013.01); *H03H 9/02157* (2013.01); *H03H 9/02228* (2013.01); *H03H 9/205* (2013.01)

(58) Field of Classification Search
CPC ...... H03H 9/568; H03H 3/02; H03H 9/02157; H03H 9/02228; H03H 9/205; H03H 9/02015; H03H 9/174; H03H 9/564
(Continued)

(56) References Cited

U.S. PATENT DOCUMENTS 5,204,575 A 4/1993 Kanda et al.
5,729,186 A 3/1998 Seki et al.
(Continued)

FOREIGN PATENT DOCUMENTS

JP 2020088459 A 6/2020
WO 2015182521 A1 12/2015
WO 2019241174 A1 12/2019

OTHER PUBLICATIONS

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).
(Continued)

*Primary Examiner* — Jorge L Salazar, Jr.
(74) *Attorney, Agent, or Firm* — ArentFox Schiff LLP

(57) ABSTRACT

Acoustic resonators, filters, and methods. A filter includes a piezoelectric plate supported by a substrate; and three or more diaphragms of the piezoelectric plate spanning a respective cavity in the substrate. A conductor pattern on the plate has interdigital transducers (IDTs) of three or more acoustic resonators. Each IDT has two sets of interleaved fingers extending from two busbars respectively. Overlapping portions of the fingers define an aperture of each acoustic resonator. Sometimes, each of the resonators has two dielectric strips that overlap the IDT fingers in first and second margins of the aperture and that extend into first and second gaps between the first and second margins and the busbars. Other times, the first and second dielectric strips are
(Continued)

on the front surface of the plate, have a first portion under the IDT fingers and have a second portion extending into a gap between the margins and the busbars.

19 Claims, 16 Drawing Sheets

Related U.S. Application Data continuation-in-part of application No. 17/542,290, filed on Dec. 3, 2021.

(60) Provisional application No. 63/237,050, filed on Aug. 25, 2021, provisional application No. 63/208,503, filed on Jun. 9, 2021, provisional application No. 63/191,897, filed on May 21, 2021, provisional application No. 63/187,932, filed on May 12, 2021, provisional application No. 63/182,465, filed on Apr. 30, 2021.

(51) Int. Cl.
*H03H 9/02* (2006.01)
*H03H 9/205* (2006.01)

(58) Field of Classification Search
USPC .......................................... 333/133, 193–196
See application file for complete search history.

(56) References Cited

U.S. PATENT DOCUMENTS

| | | | |
|---|---|---|---|
| 6,172,582 B1 | 1/2001 | Hickernell | |
| 6,271,617 B1 | 8/2001 | Yoneda et al. | |
| 7,009,468 B2 | 3/2006 | Kadota et al. | |
| 9,748,924 B2 | 8/2017 | Komatsu et al. | |
| 2003/0042998 A1 | 3/2003 | Edmonson | |
| 2005/0077982 A1 | 4/2005 | Funasaka | |
| 2012/0073390 A1 | 3/2012 | Zaghloul et al. | |
| 2012/0198672 A1 | 8/2012 | Ueda et al. | |
| 2013/0147577 A1* | 6/2013 | Nishihara | H03H 9/54 |
| | | | 333/133 |
| 2015/0014795 A1 | 1/2015 | Franosch et al. | |
| 2017/0077902 A1 | 3/2017 | Daimon | |
| 2018/0309426 A1 | 10/2018 | Guenard et al. | |
| 2020/0162052 A1 | 5/2020 | Matsuoka et al. | |
| 2020/0274520 A1 | 8/2020 | Shin et al. | |
| 2021/0067134 A1 | 3/2021 | Fujiwara | |
| 2021/0265978 A1 | 8/2021 | Plesski et al. | |
| 2021/0351762 A1 | 11/2021 | Dyer et al. | |
| 2023/0336143 A1* | 10/2023 | Kimura | H03H 9/02228 |

OTHER PUBLICATIONS

Gnewuch, et al. "Broadband monolithic acousto-optic tunable filter", Mar. 1, 2000 / vol. 25, No. 5 / Optics Letters (Year: 2000).

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Reinhardt, "Acoustic filters based on thin single crystal LiNbQ,3 films: status and prospects", 2014 IEEE International Ultrasonics Symposium Proceedings, pp. 773-781 (Year: 2014).

Sinha et al., "Slanted finger Inter-digital Transducers for the design of improved performance small shape factor mid-bandwidth SAW filters", IEEE MTT-S International Microwave and RF Conference, 2013. (Year: 2013).

Wu et al., "Frequency band-gap measurement of two-dimensional air/silicon phononic crystals using layered slanted finger interdigital transducers", J. Appl. Phys. 97, 094916, 2005 (Year: 2005).

* cited by examiner

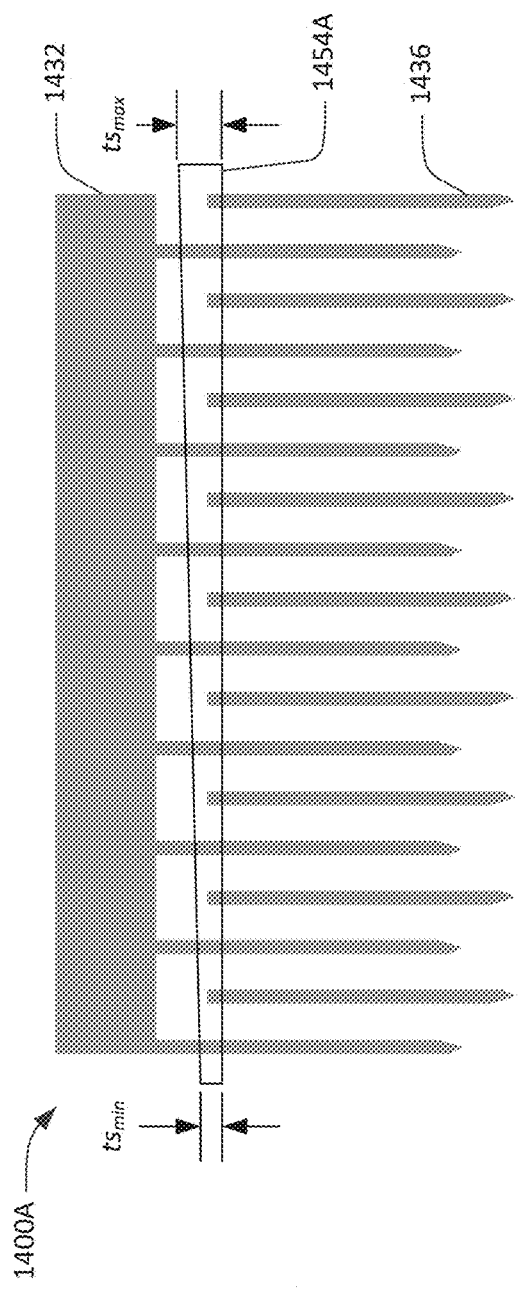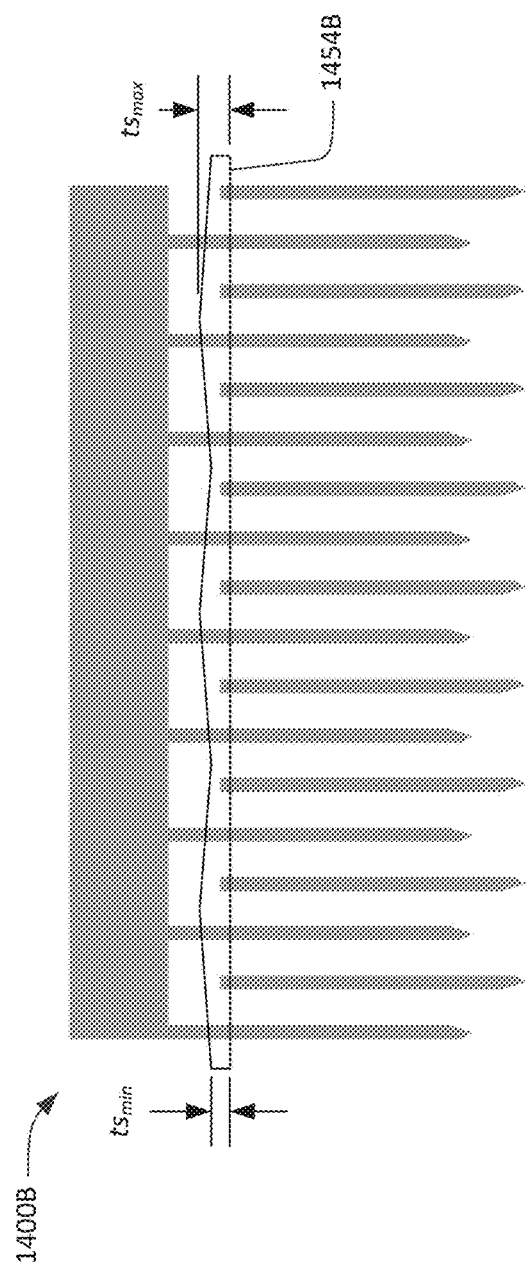
FIG. 14A
FIG. 14B

TRANSVERSELY-EXCITED FILM BULK ACOUSTIC RESONATOR WITH OXIDE STRIP ACOUSTIC CONFINEMENT STRUCTURES

RELATED APPLICATION INFORMATION

This patent is a continuation-in-part of application Ser. No. 17/555,353, filed Dec. 17, 2021, entitled TRANSVERSELY-EXCITED FILM BULK ACOUSTIC RESONATOR WITH BURIED OXIDE STRIP ACOUSTIC CONFINEMENT STRUCTURES, which claims priority from provisional patent application 63/237,050, filed Aug. 25, 2021, entitled DECOUPLED OXIDE STRIP ACOUSTIC CONFINEMENT STRUCTURES FOR Z-CUT LN, and which is a continuation-in-part of application Ser. No. 17/542,290, filed Dec. 3, 2021, entitled TRANSVERSELY-EXCITED FILM BULK ACOUSTIC RESONATOR WITH OXIDE STRIP ACOUSTIC CONFINEMENT STRUCTURES, which claims priority from the following provisional patent applications: 63/182,465, filed Apr. 30, 2021, entitled OXIDE STRIP ACOUSTIC CONFINEMENT STRUCTURES FOR Z-CUT LN; 63/187,932, filed May 12, 2021, entitled DUAL OXIDE STRIP ACOUSTIC CONFINEMENT STRUCTURES FOR Z-CUT LN; 63/191,897, filed May 21, 2021, entitled BEST PRACTICES FOR OXIDE STRIP ACOUSTIC CONFINEMENT STRUCTURES; and 63/208,503, filed Jun. 9, 2021, entitled CHIRPED WIDE OXIDE STRIP ACOUSTIC CONFINEMENT STRUCTURES. The entire content of these applications is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

DESCRIPTION OF THE DRAWINGS

FIG. 14A and FIG. 14B are schematic plan views of different embodiments of oxide strip acoustic confinement structures.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
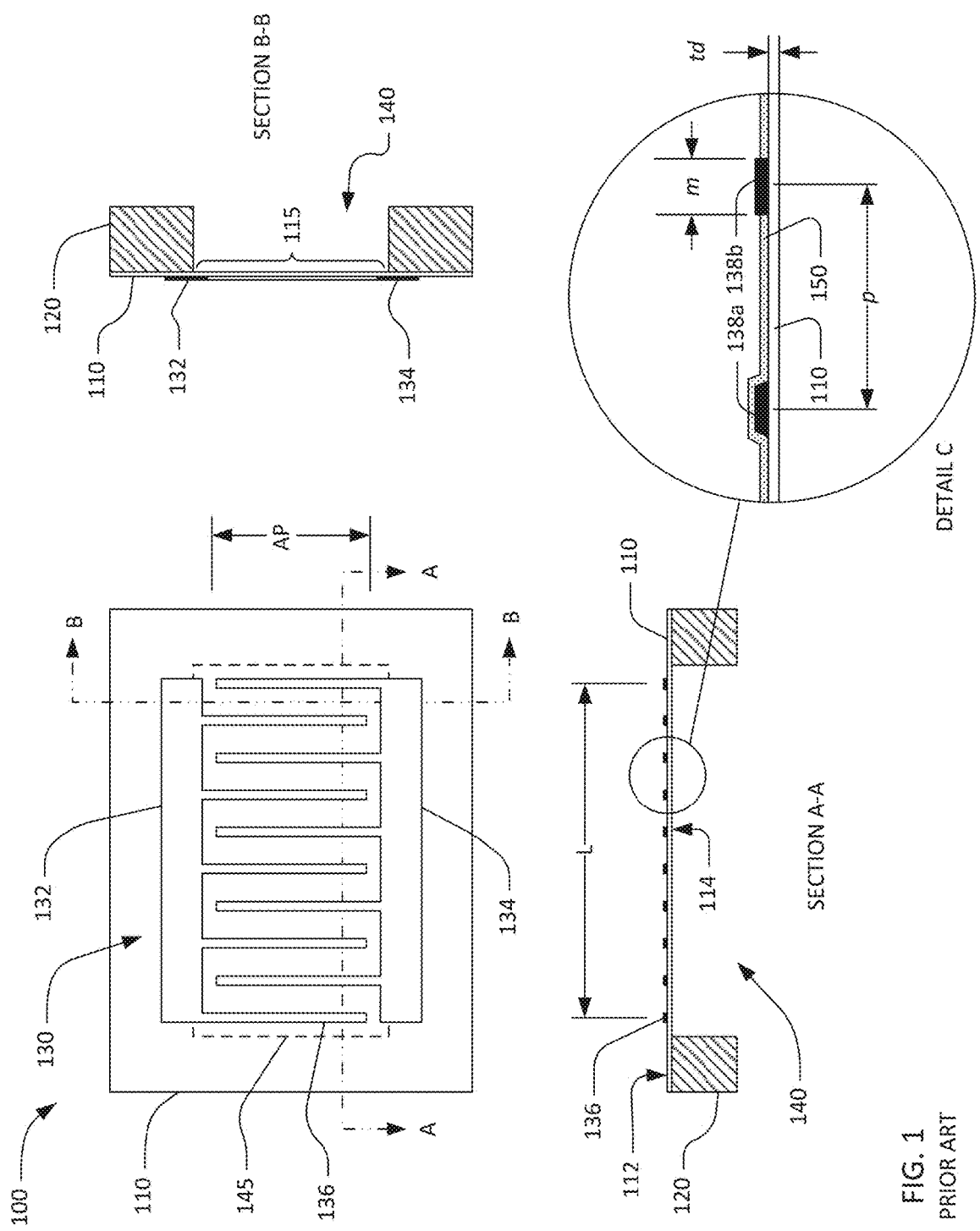
FIG. 1 includes a schematic plan view, two schematic cross-sectional views, and a detail view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 130 is the "length" of the IDT. The direction perpendicular to the IDT fingers will be referred to herein as the "length direction."

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and mark ("mark" is a term commonly used to refer to the dimension perpendicular to the long axis of a conductor such as an IDT finger) of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Referring to the detailed cross-sectional view (Detail C), a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide or silicon nitride. The thickness of the front side dielectric layer is typically less than or equal to the thickness of the piezoelectric plate. The front-side dielectric layer 150 may be formed of multiple layers of two or more materials.

The IDT fingers 138a and 138b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars 132, 134 of the IDT may be made of the same or different materials as the fingers.

Dimension p is the center-to-center spacing or "pitch" of the IDT fingers, which may be referred to as the pitch of the IDT and/or the pitch of the XBAR. Dimension m is the mark of the IDT fingers.

As shown in DETAIL C, IDT finger 138a has a trapezoidal cross-sectional shape and IDT finger 138b has a rectangular cross-sectional shape. The IDT fingers 138a, 138b may have some other cross-section, such as T-shaped or stepped.

The IDT fingers 138a, 138b are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 138a, 138b and the piezoelectric plate 110. Although not shown in FIG. 1, some or all IDT fingers may be disposed in grooves or slots extending partially or completely through the piezoelectric plate 110.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2B:
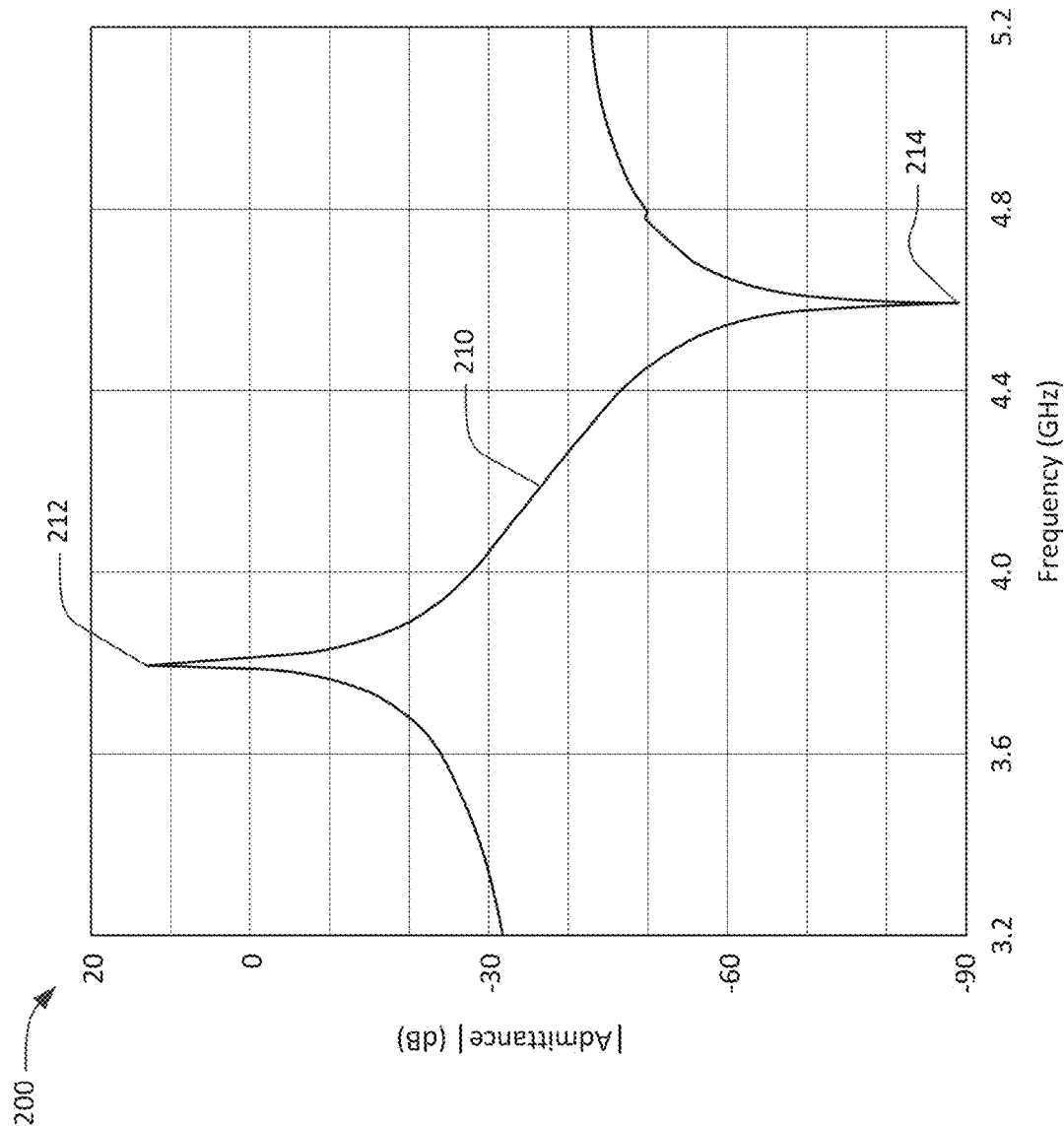
FIG. 2B is a graph of the magnitude of admittance of an ideal acoustic resonator.
Figure 2A:
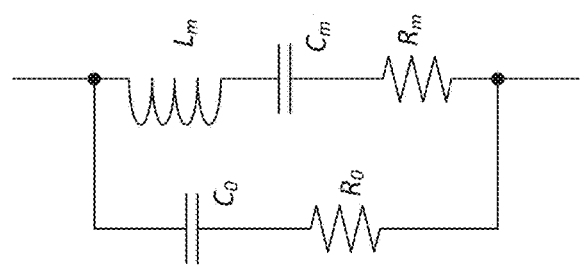
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma=C_0/C_m$ is dependent on the resonator structure and the type and the orientation of the crystalline axes of the piezoelectric material.

FIG. 2B is a graph 200 of the performance of a theoretical lossless acoustic resonator. Specifically, the solid curve 210 is a plot of the magnitude of admittance of the acoustic resonator as a function of frequency. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r \sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 3:
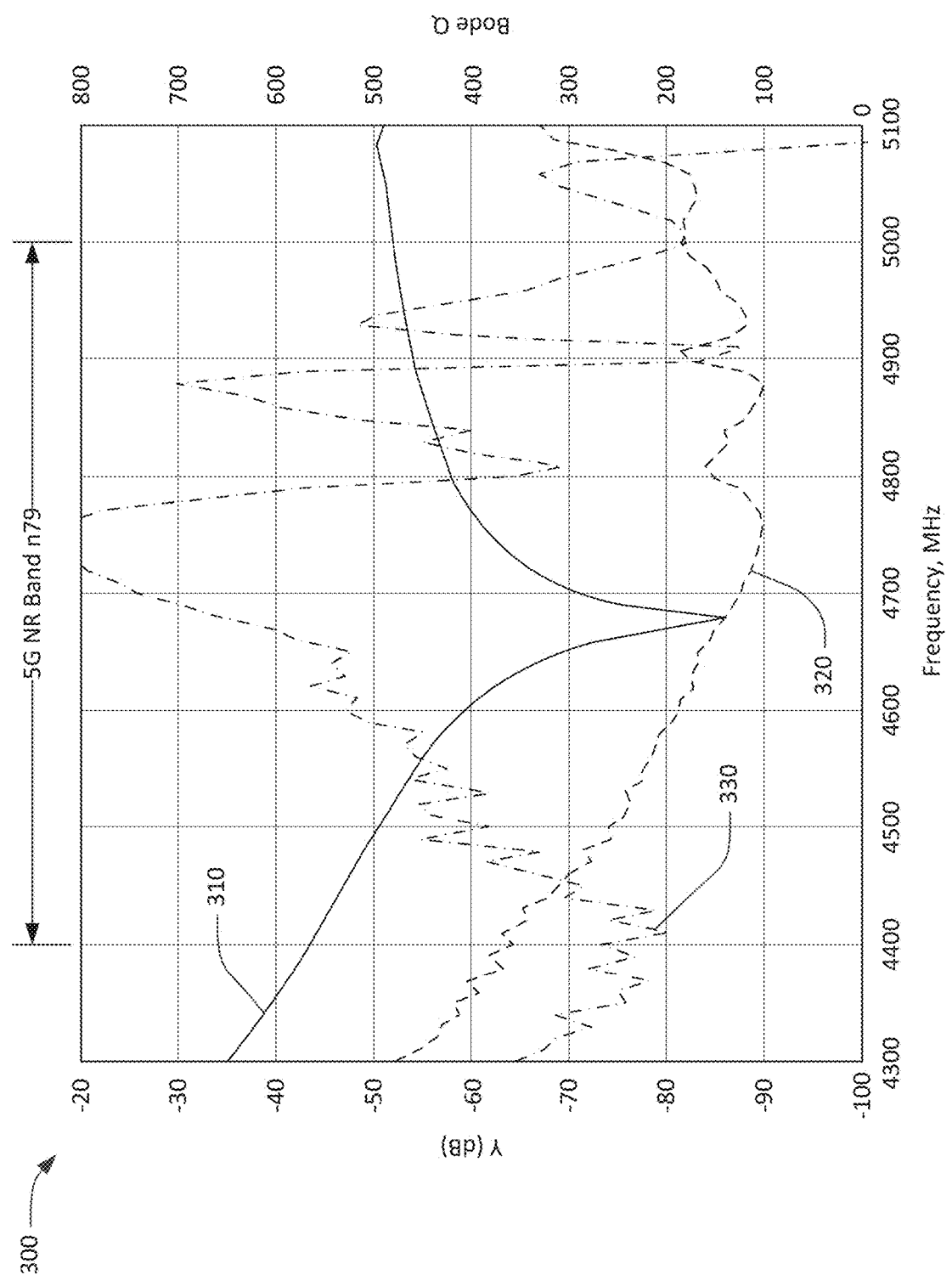
FIG. 3 is a graph of the admittance and Bode Q of a representative XBAR as functions of frequency.

FIG. 3 shows a graph 300 showing the performance of an exemplary XBAR. The data for FIG. 3 and all subsequent graphs results from simulation of exemplary XBAR devices using a finite element three-dimensional simulation technique.

Specifically, the solid curve 310 is a plot of the magnitude of admittance of the exemplary XBAR as a function of frequency. The dashed line 320 is a plot of the real component of admittance for the XBAR. The curves 310 and 320 are read using the left-hand vertical axis. The exemplary XBAR includes a Z-cut lithium niobate piezoelectric plate with a thickness of 0.368 um. The IDT pitch is 4.4 um, and the IDT finger mark is 0.96 um. The IDT mark/pitch ratio is 0.22. The IDT is predominantly aluminum with a total thickness of 0.491 um. The gap between the ends of the IDT fingers and the adjacent busbar is 5.0 um. The XBAR has a resonance frequency about 4250 MHz (not shown) and an anti-resonance frequency about 4680 MHz. The exemplary XBAR may be, for example, a shunt resonator for a band n79 bandpass filter. The frequency range of the graph 300 spans the n79 band from 4400 MHz to 5000 MHz which includes the admittance minimum at the anti-resonance of the XBAR.

The dot-dash curve 330 is a plot of the Bode Q-factor for the XBAR. Bode Q-factor is a measure of the efficiency of a resonator and is equal to $2\pi$ times the peak energy stored during a cycle of the input signal divided by the total energy dissipated during the cycle. The curve 330 is read against the right-hand vertical axis.

Figure 4:
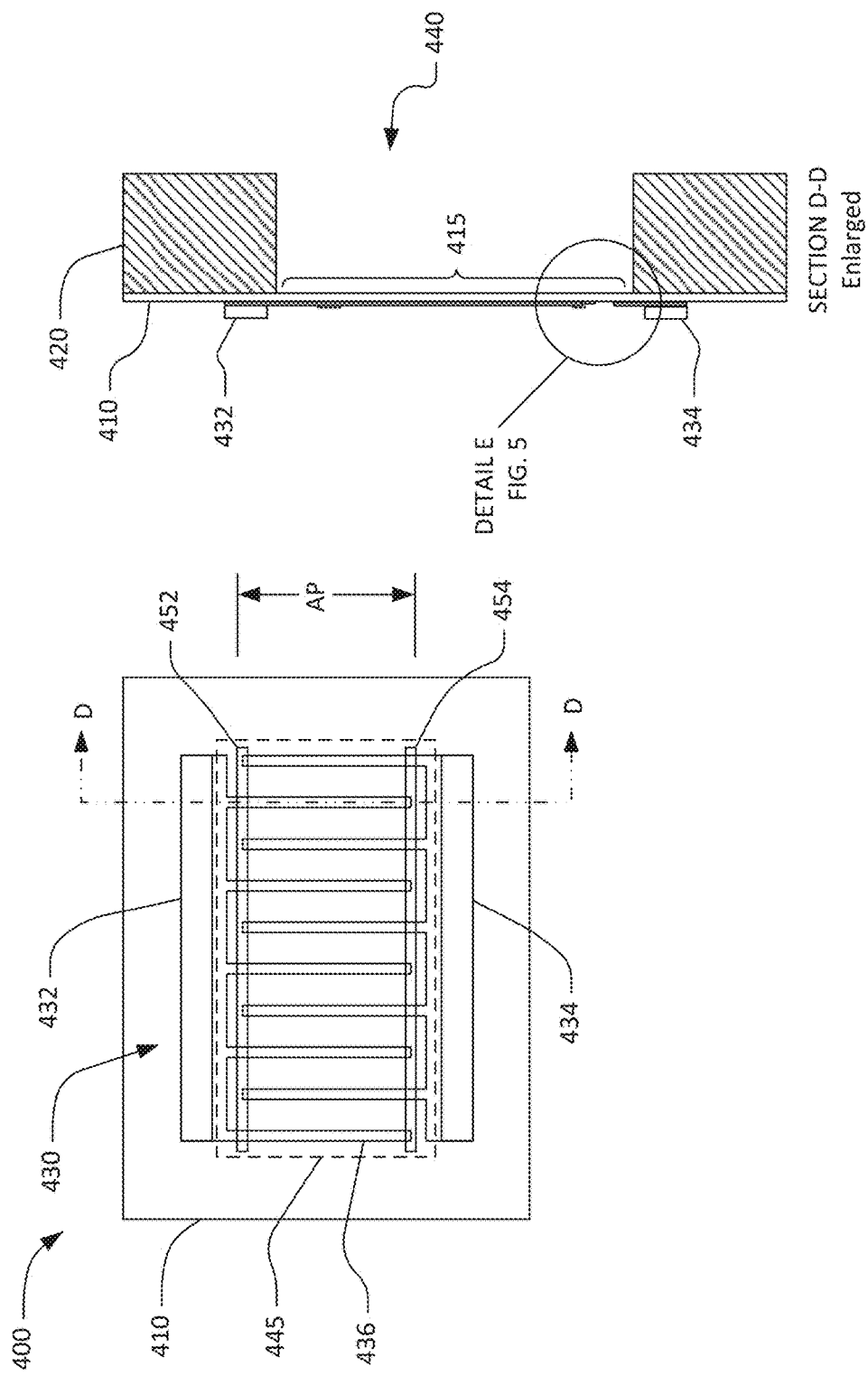
FIG. 4 includes a schematic plan view and an enlarged schematic cross-sectional view of an XBAR with an oxide strip acoustic confinement structure.

FIG. 4 shows a simplified schematic top view and enlarged cross-sectional view of a transversely-excited film bulk acoustic resonator (XBAR) 400. The XBAR 400 is generally similarly to the XBAR 100 of FIG. 1 with the addition of a first dielectric strip acoustic confinement structure (ACS) 452 and a second dielectric strip ACS 454.

The XBAR 400 includes a thin film conductor pattern formed on a surface of a piezoelectric plate 410. The piezoelectric plate 410 may be a thin plate of a single-crystal piezoelectric material. The material and the crystal orientation of the piezoelectric plate 410 may be as previously described.

A back surface of the piezoelectric plate 410 is attached to a surface of a substrate 420 except for a portion of the piezoelectric plate 410 that forms a diaphragm 415 spanning a cavity 440 formed in the substrate. The substrate 420 may be, for example, silicon, sapphire, quartz, or some other material or combination of materials. The piezoelectric plate 410 and the substrate 420 may be bonded or attached as previously described.

The conductor pattern of the XBAR 400 includes an interdigital transducer (IDT) 430. The IDT 430 includes a first plurality of parallel fingers, such as finger 436, extending from a first busbar 432 and a second plurality of fingers extending from a second busbar 434. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 430 is the "length" of the IDT. The direction perpendicular to the IDT fingers will be referred to herein as the "length direction." The IDT 430 is positioned on the piezoelectric plate 410 such that at least the fingers of the IDT 430 are disposed on the diaphragm 415. The materials of the conductor pattern may be as previously described.

Each dielectric strip ACS 452, 454 is a strip of dielectric material that overlaps the IDT fingers at the margins of the aperture and extends into the gap between the ends of the IDT fingers and the adjacent busbars. In this context, the term "margin" means "the extreme edge of something and the area lying parallel to and immediately adjoining this edge especially when in some way distinguished from the remaining area lying farther in." In this case, the margins of the aperture are distinguished by the presence of the dielectric strip ACS overlapping the IDT fingers.

The first dielectric strip ACS 452, which is proximate the first busbar 432, overlaps the IDT fingers in a first margin of the aperture. The first dielectric strip ACS 452 extends into the gap between the first busbar and ends of the IDT fingers extending from the second busbar. The second dielectric strip ACS 454 overlaps the IDT fingers in a second margin of the aperture. The second dielectric strip ACS 454 extends into the gap between the second busbar and ends of the IDT fingers extending from the first busbar.

The first and second dielectric strips ACS 452, 454 extend the entire length of the IDS 430, which is to say the ACS overlaps the ends of all the fingers of the IDT. The ACS 452, 454 may extend beyond the length of the IDT 430 as shown in FIG. 4. The dielectric strips may be silicon dioxide, silicon nitride, aluminum oxide, titanium dioxide, titanium nitride, diamond, or some other dielectric material. In all of the subsequent examples, the dielectric strips are silicon dioxide.

Figure 5:
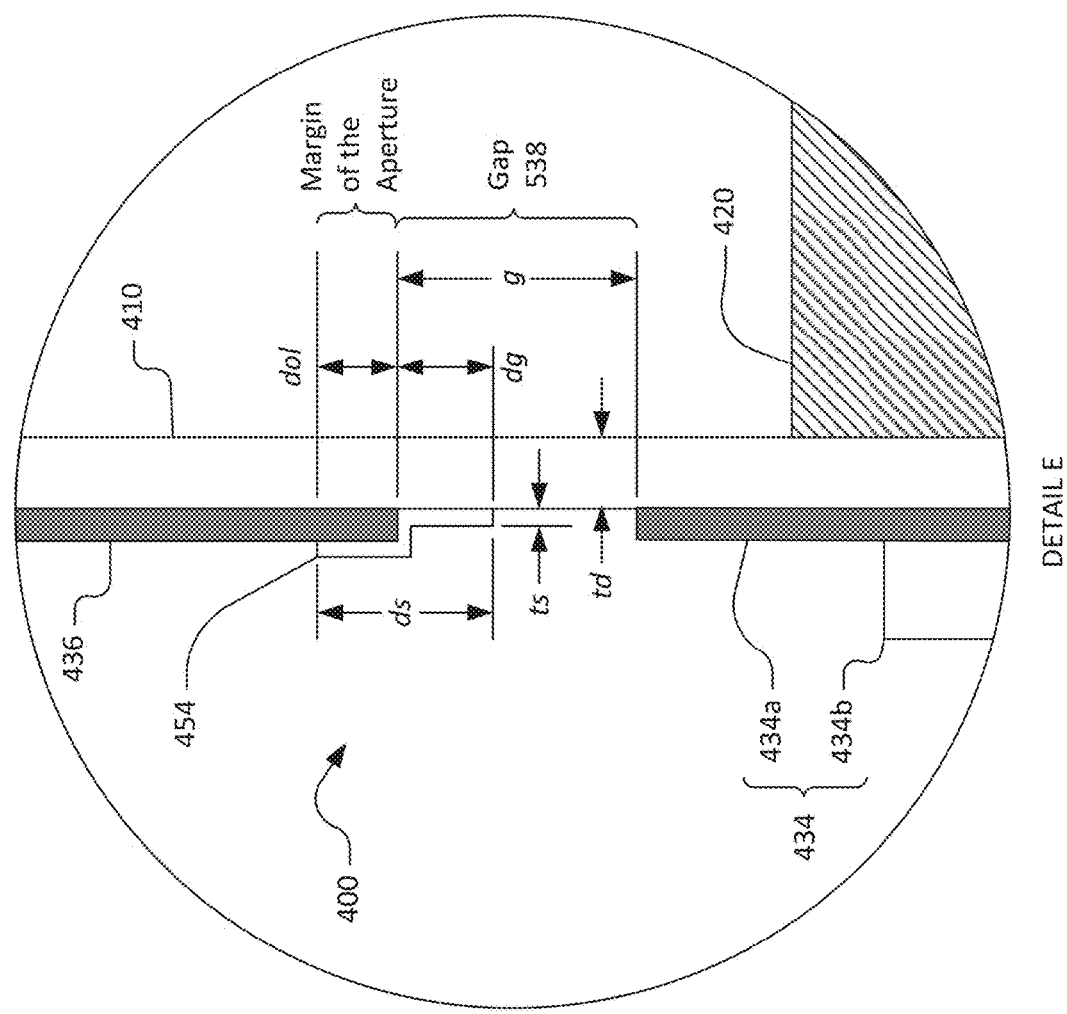
FIG. 5 is a detailed cross-sectional view of the acoustic confinement structure of FIG. 4.

FIG. 5 is a detailed cross-sectional view of a portion of XBAR 400 identified as "Detail E" in FIG. 4. FIG. 5 shows portions of the piezoelectric plate 410 and the substrate 420. An IDT finger 436 and a portion 434a of the second bus bar 434 are formed in a first conductor level. The bus bar 434 typically includes a second conductor level 434b. The gap 538 between the end of the IDT finger 436 and the portion of the busbar 434a has a width g. The term "width" means a dimension in the aperture direction (measured parallel to the long direction of the IDT fingers).

The dielectric strip ACS 454 has a total width of ds, of which a first portion with a width dol overlaps the IDT finger 436 in the margin of the aperture, and a second portion with a width dg is disposed on the diaphragm 410 in the gap 538. dg is less than g such that the second portion of the dielectric strip ACS 454 does not span the gap 538. The thickness is of the dielectric strip ACS may be between 4 nm and 30 nm. The thickness td of the piezoelectric plate 410 may be between 100 nm and 1000 nm. The effect of the thickness of the dielectric strip ACS will be discussed subsequently.

Figure 6:
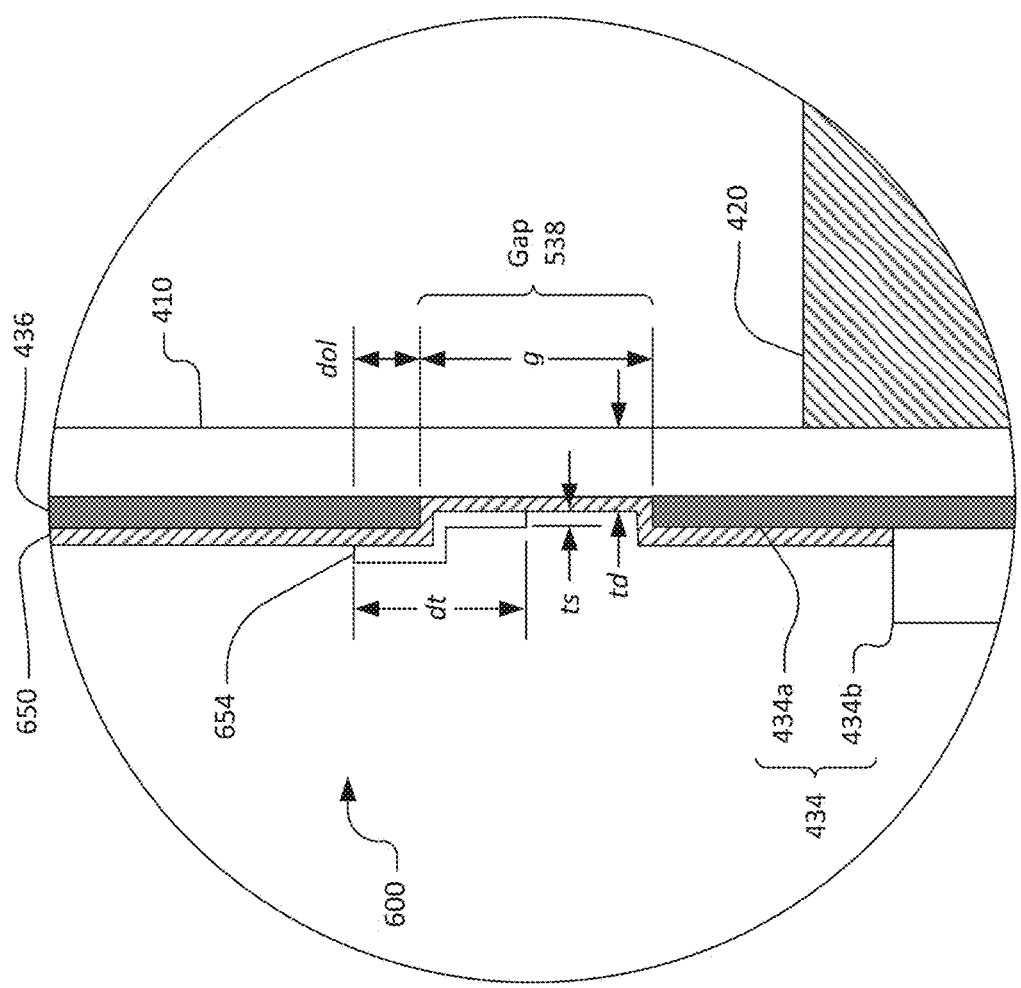
FIG. 6 is a detailed cross-sectional view of another acoustic confinement structure.

FIG. 6 is a detailed cross-sectional view of a portion of another XBAR 600. The XBAR 600 is similar to the XBAR 400 shown in FIG. 5 with the addition of a dielectric layer 650 over the surface of the diaphragm 410 extending in the length direction between the IDT finger 436. Layer 650 may also extend in the aperture direction along the sides of the IDT fingers from the busbar it extends from, to dielectric strip 654; and vertically between the plate 410 and the dielectric strip 654. All of the other elements and dimensions of the XBAR 600 are the same as the corresponding elements of the XBAR 400.

In the example of FIG. 6, the ACS 654 is over (i.e. further from the piezoelectric plate 410) the dielectric layer 650, which implies the ACS 654 was formed after the dielectric layer 650. The converse, with the dielectric layer 650 over the ACS 654, is also possible. In some embodiments, a first dielectric layer 650 may be under the ACS 654 and a second dielectric layer (not shown) may be over the ACS 654. For example, the first dielectric layer may be a frequency-setting layer, as described in patent U.S. Pat. No. 10,917,070, and the second dielectric layer may be a passivation layer to seal the conductor pattern and other surfaces of the XBAR 600.

In the examples of FIG. 7, FIG. 8, FIG. 9 and FIG. 11, the piezoelectric plate 410 is Z-cut lithium niobate with a thickness of 370 nm. The dielectric layer 650 is silicon dioxide with a thickness of 130 nm. The total diaphragm thickness td is 500 nm. In some cases, herein, calculations using thickness td are with respect to only the thickness of the piezoelectric plate and there are no dielectric layers on the plate. In other cases, calculations using thickness td are with respect to the aggregate thickness of the piezoelectric plate and the topside dielectric 650, which may be different for shunt and series resonators.

Figure 7:
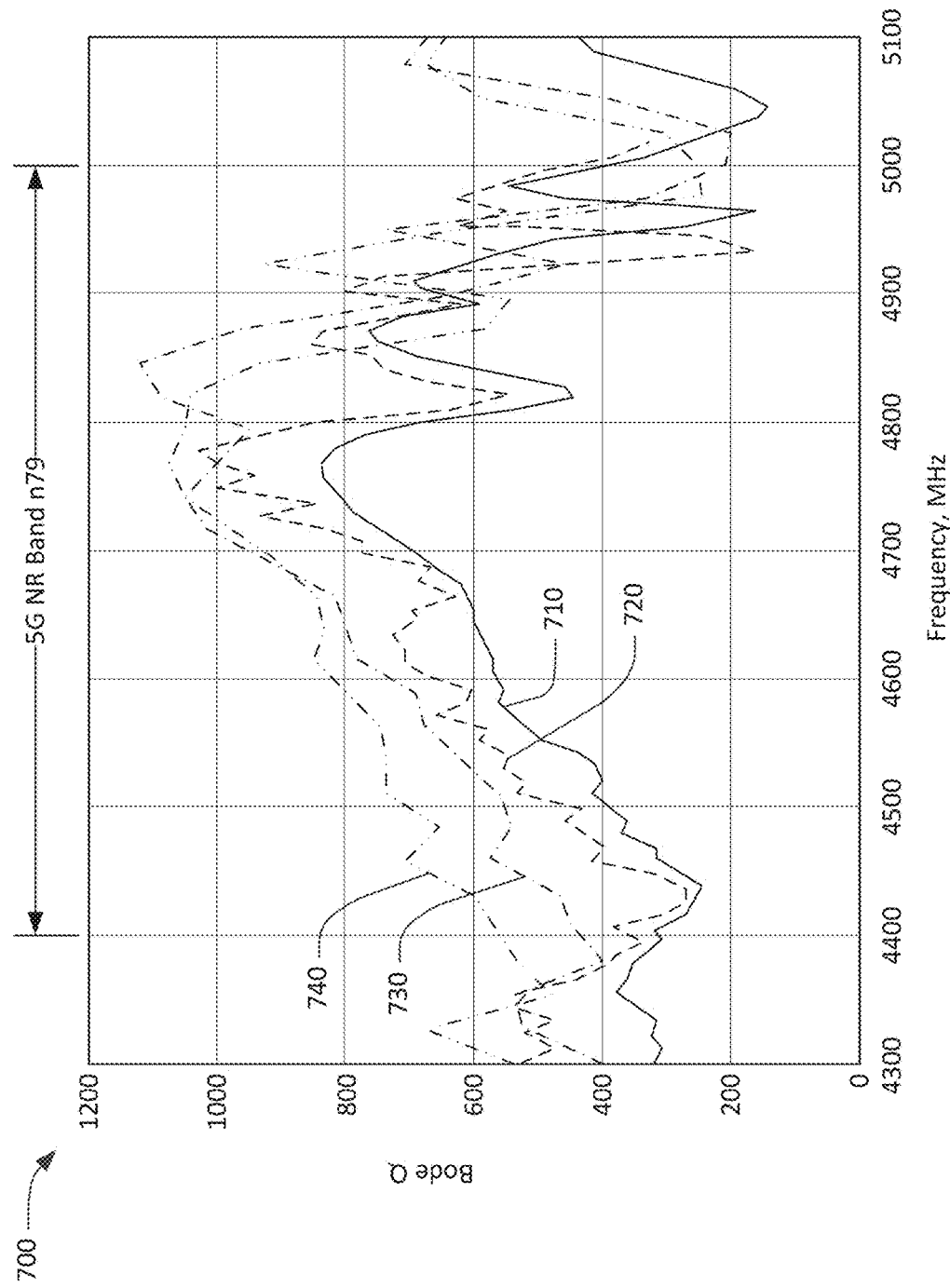
FIG. 7 is a graph comparing the Bode Q of XBARs with different acoustic confinement structures.

FIG. 7 shows a graph 700 illustrating the benefit of a dielectric strip ACS. Specifically, the solid curve 710 is a plot of the Bode Q of an exemplary XBAR without an ACS. The curve 710 is the same as the curve 330 of FIG. 3 with a different vertical scale.

The characteristics of XBAR devices scale with frequency. Frequency, in turn, is inversely dependent on the thickness of the diaphragm including the piezoelectric plate and any dielectric layers. For XBARs for applications and frequencies other than the n79 shunt resonator used in all of the examples in this patent, the dimensions of the dielectric strip ACS will approximately scale with the thickness td of the diaphragm. For some of the examples in this patent, the diaphragm thickness td is 0.50 μm (500 nm). Other applications may have diaphragm thickness td with a range of 100 nm to 1000 nm.

The dashed curve 720 is a plot of the Bode Q of a similar XBAR with a dielectric strip in the margins of the aperture. The dielectric strip has a width of 0.68 μm and does not extend into the gap between the ends of the IDT fingers and the busbars. The thickness is of the dielectric strip is 15 nm or 0.03 td. Referring to the dimensions defined in FIG. 5, this dielectric strip has ds=dol=0.68 μm=1.36 td, and dg=0.

The dot-dash curve 730 is a plot of the Bode Q of a similar XBAR with a dielectric strip only in the gaps between the ends of the IDT fingers and the busbars. The dielectric strips have a width of 1 μm and are positioned 0.2 μm from the ends of the IDT fingers. The thickness ts of the dielectric strip is 15 nm or 0.03 td. Referring to the dimensions defined in FIG. 5, this dielectric strip has dol=0 and ds=dg=1.0 μm=2.0 td.

The dot-dot-dash curve 740 is a plot of the Bode Q of a similar XBAR with a dielectric strip ACS that overlaps the ends of the IDT fingers and extends into the gaps as shown in FIG. 5. The thickness ts of the dielectric strip is 15 nm or 0.03 td. Referring to the dimensions defined in FIG. 5, this dielectric strip has ds=2.2 μm=4.4 td; dol=1.0 μm=2.0 td; and dg=1.2 μm=2.4 td.

Comparison of the curves 710, 720, 730, and 740 shows that the addition of a narrow (i.e. ds=2.0 td) dielectric strip either on the IDT fingers or in the gap (curves 720, 730) provides an improvement in Bode Q near the lower band edge. The wide dielectric strip (ds=4.4 td, curve 740) that overlaps the ends of the IDT fingers and extends into the gaps provides higher Bode Q near the lower band edge than either of the narrow dielectric strips.

The presence of a dielectric strip ACS improves Bode Q between the resonance and antiresonance frequencies but may reduce Bode Q at frequencies lower than resonance and above antiresonance. Overall, this can be a beneficial tradeoff. The sharpness of a filter transfer function at its lower band edge depends mostly on the Bode Q of shunt resonators between resonance and antiresonance, the contribution from series resonators can be limiting if their Bode Q at the lower band edge is too low. Similarly, while the Bode Q of the series resonators is most important at the upper band edge, the sharpness of the upper band edge may be limited if the Bode Q of shunt resonators is too low. The design of a filter is a continuous tradeoff of factors including the geometry of the dielectric strip ACS on each resonator.

For XBARs using Z-cut lithium niobate piezoelectric plates, the primary effect that limits Bode Q between resonance and antiresonance is excitation of unwanted obliquely traveling waves in a finite aperture device. Adding a dielectric strip ACS suppresses the excitation of unwanted oblique waves. Losses due to excitation of obliquely traveling waves are unrelated to coupling to the y-component of the electric field. That is a separate and relatively negligible source of loss which is dwarfed in comparison to the excitation of oblique waves. Obliquely traveling waves are excited because of the mechanical difference between the IDT and gap region, which the dielectric strip addresses.

Figure 8:
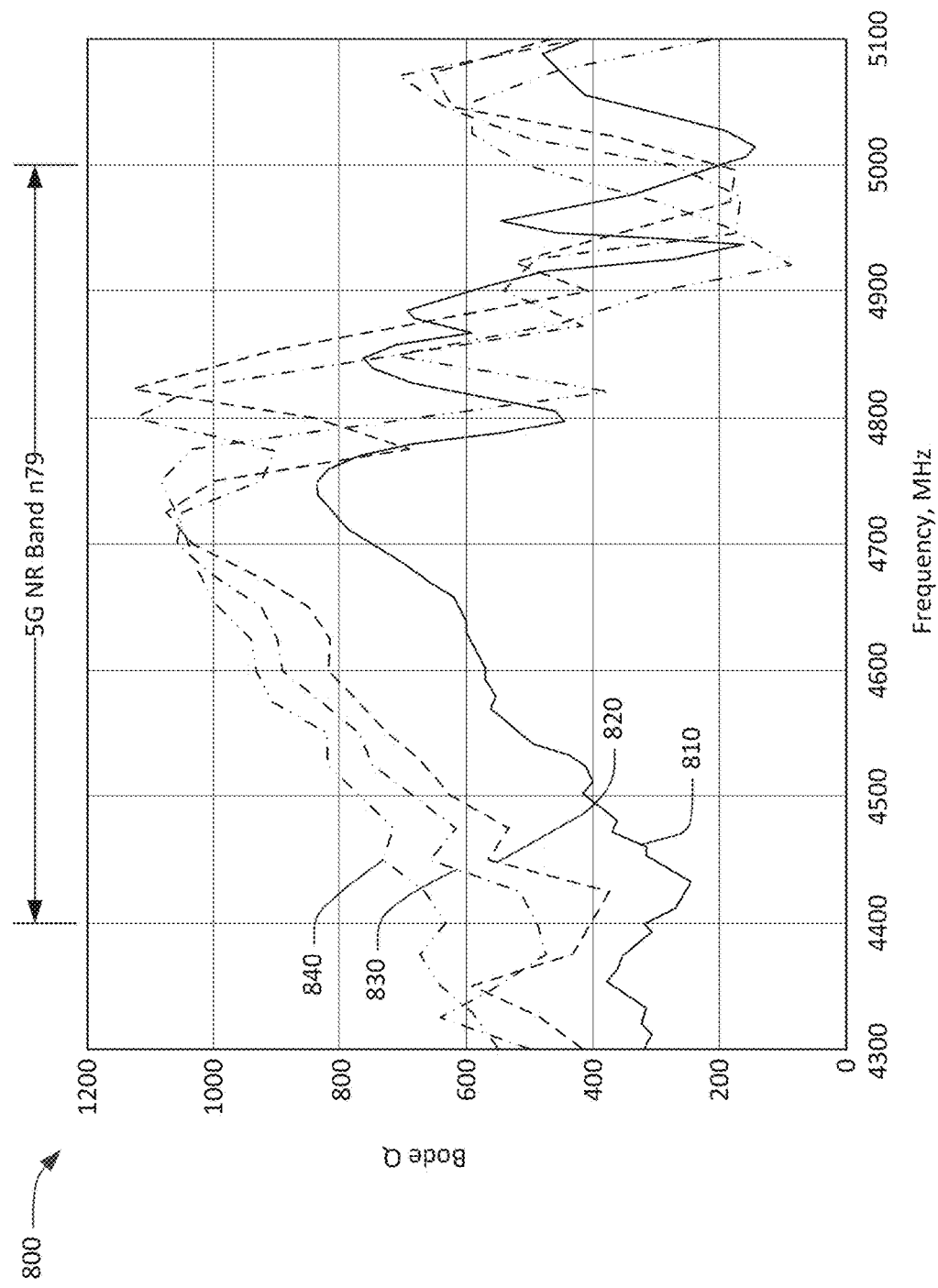
FIG. 8 is a graph comparing the Bode Q of XBARs with different acoustic confinement structures.

FIG. 8 shows a graph 800 illustrating the relationship between Bode Q and the thickness of a dielectric strip ACS. Specifically, the solid curve 810 is a plot of the Bode Q of an exemplary XBAR without an ACS. The curve 810 is the same as the curve 330 of FIG. 3 with a different vertical scale. The other three curves are plots of the Bode Q of similar XBARs with wide dielectric strip ACSs of differing thickness that overlap the ends of the IDT fingers and extend into the gaps. The dimensions of the ACSs for curves 720, 730, and 740 are ds=2.9 μm=5.8 td, dol=0.7 μm=1.4 td, and dg=2.2 μm or 4.4 td.

The dashed curve 820 is a plot of the Bode Q of a similar XBAR with a wide dielectric strip ACS with a thickness ts equal to 4 nm or 0.008 td. The dot-dash curve 830 is a plot of the Bode Q of another XBAR with a similar dielectric strip ACS with a thickness ts=8 nm or 0.016 td. The dot-dot-dash curve 840 is a plot of the Bode Q of another XBAR with a thickness ts=15 nm or 0.030 td.

Comparison of the curves 810, 820, 830, and 840 shows that a wide dielectric strip ACS with a thickness of only 0.008 td provides a significant improvement in Bode Q near the lower band edge. The Bode Q near the lower band edge improves with increasing dielectric strip thickness up to at least 0.030 td. There is small additional improvement in Bode Q for thicker dielectric strips, but other losses may become significant for dielectric strips with ts>0.06 td.

Figure 9:
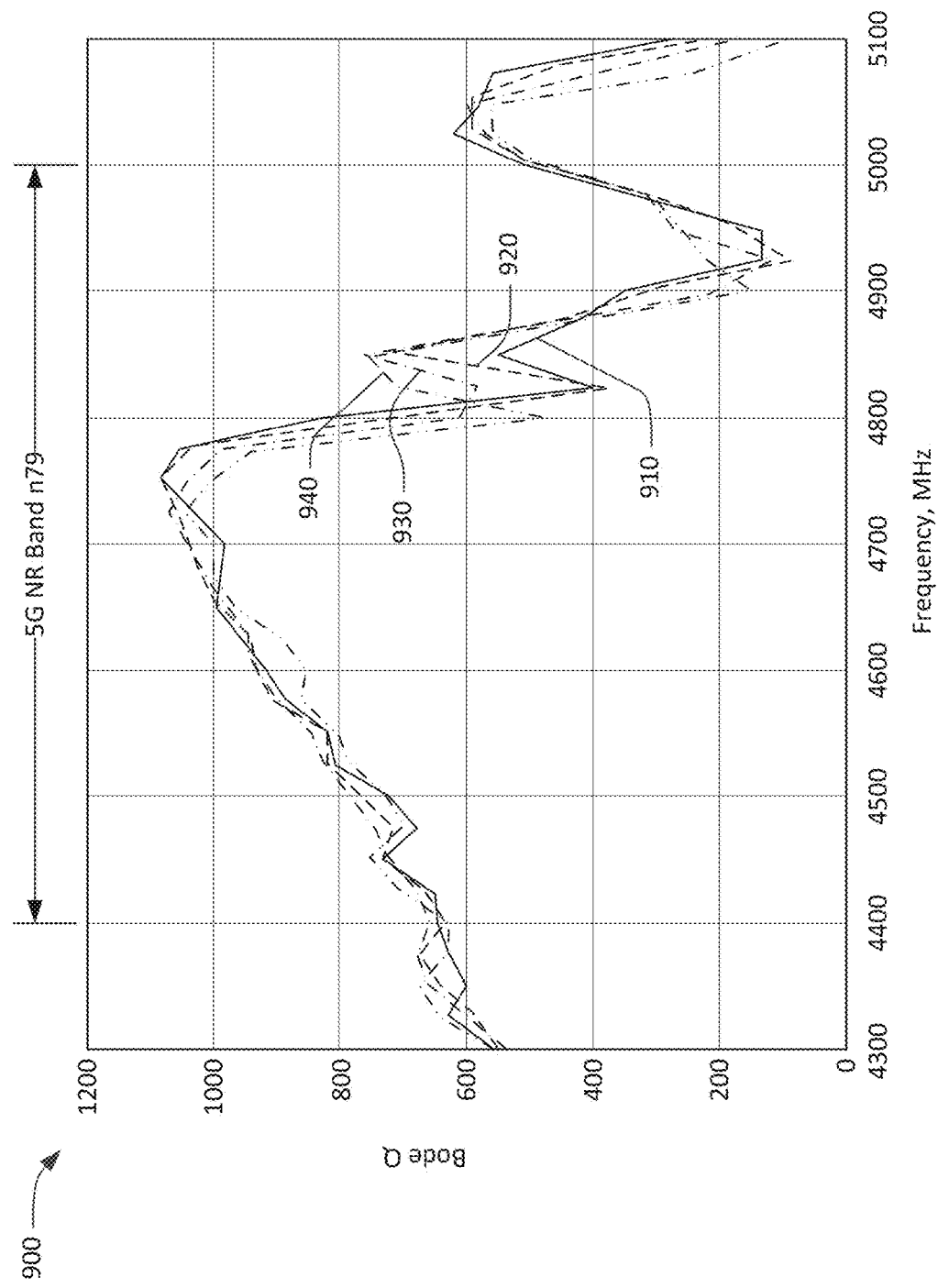
FIG. 9 is a graph comparing the Bode Q of XBARs with different acoustic confinement structures.

FIG. 9 shows a graph 800 illustrating the relationship between Bode Q and the overlap of a dielectric strip ACS with the IDT fingers of an XBAR. Specifically, the curves 910, 920, 930, and 940 are plots of the Bode Q of exemplary XBARS with dielectric strip ACS having dimensions (as defined in FIG. 5) dg=2.2 µm=4.4 td and ts=15 nm=0.03 td.

The solid curve 910 is a plot of the Bode Q of an exemplary XBAR with a dielectric strip ACS with dol=0.3 µm=0.60 td. The dashed curve 920 is a plot of the Bode Q of an exemplary XBAR with a dol=0.7 µm=1.40 td. The dot-dash curve 930 is a plot of the Bode Q of an exemplary XBAR with dol=1.0 µm=2.0 td. The dot-dot-dash curve 940 is a plot of the Bode Q of an exemplary XBAR with a dielectric strip ACS with dol=1.5 µm=3.0 td. Comparison of the curves 910, 920, 930, 940 shows there is little dependence of Bode Q on the overlap distance dol, particularly for frequencies near the lower edge of the n79 band, over the ranges 0.6 td<dol<3.0 td and 5.0 td<ds<7.4 td.

The examples of FIG. 7, FIG. 8, and FIG. 9 do not represent the entire range of useful dimensions for a dielectric strip ACS. Additional improvement in Bode Q may be obtained with even wider dielectric strip ACS. A filter example to be discussed subsequently includes dielectric strip ACS with ds as large as 16 td and dol as large as 8 td.

Figure 10:
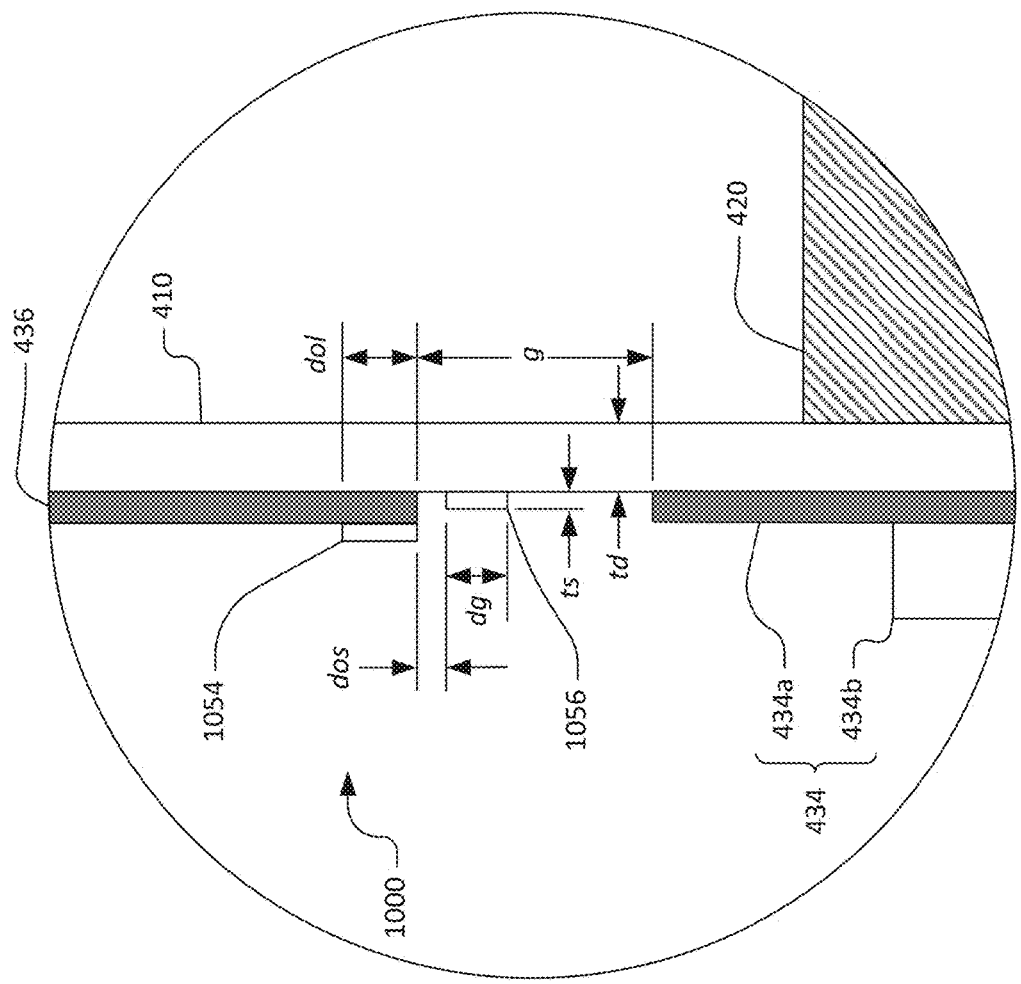
FIG. 10 is a detailed cross-sectional view of another acoustic confinement structure.

FIG. 10 is a detailed cross-sectional view of a portion of another XBAR 1000. The XBAR 1000 is similar to the XBAR 400 shown in FIG. 5 except that the ACS is separated into a first portion 1054 that overlaps the ends on the IDT conductor 436 in the margins of the aperture and a second portion, 1056 on the surface of the diaphragm 410 in the gap between the ends of the IDT fingers 436 and the busbar 434. The first and second portions 1054, 1056 are not contiguous, but are separate by a small distance. The width, in the aperture direction, of the first portion is dol and the width of the second portion is dg. The distance between the first and second portions 1054, 1056 is dos. All of the other elements and dimensions of the XBAR 1000 are the same as the corresponding elements of the XBAR 400.

Figure 11:
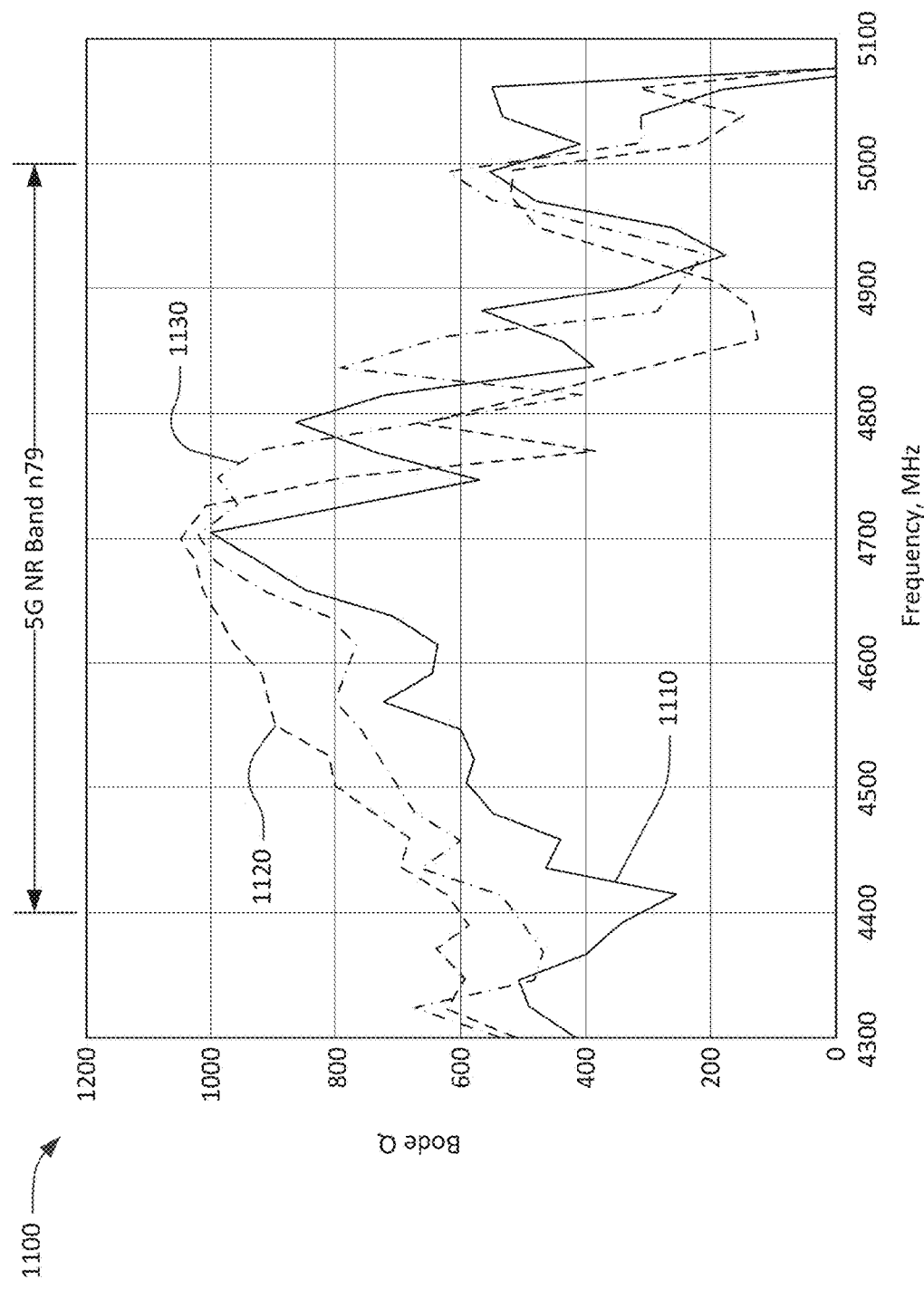
FIG. 11 is a graph comparing the Bode Q of XBARs with different acoustic confinement structures.

FIG. 11 shows a graph 1100 illustrating the relationship between Bode Q and the dimensions of a dielectric strip ACS divided into two portions as shown in FIG. 10. Specifically, the solid curve 1110 is a plot of the Bode Q of an exemplary XBAR without a dielectric strip ACS. The dashed curve 1120 is a plot of the Bode Q of an exemplary XBAR with a dol=2.0 µm=4.0 td, dos=0.2 µm=0.4 td, dg=2.0 µm=4.0 td, and ts=15 nm=0.03 td. The dot-dash curve 1130 is a plot of the Bode Q of an exemplary XBAR with dol=2.0 µm=4.0 td, dos=2.0 µm=4.0 td, dg=2.0 µm=4.0 td, and ts=30 nm=0.06 td.

Figure 12:
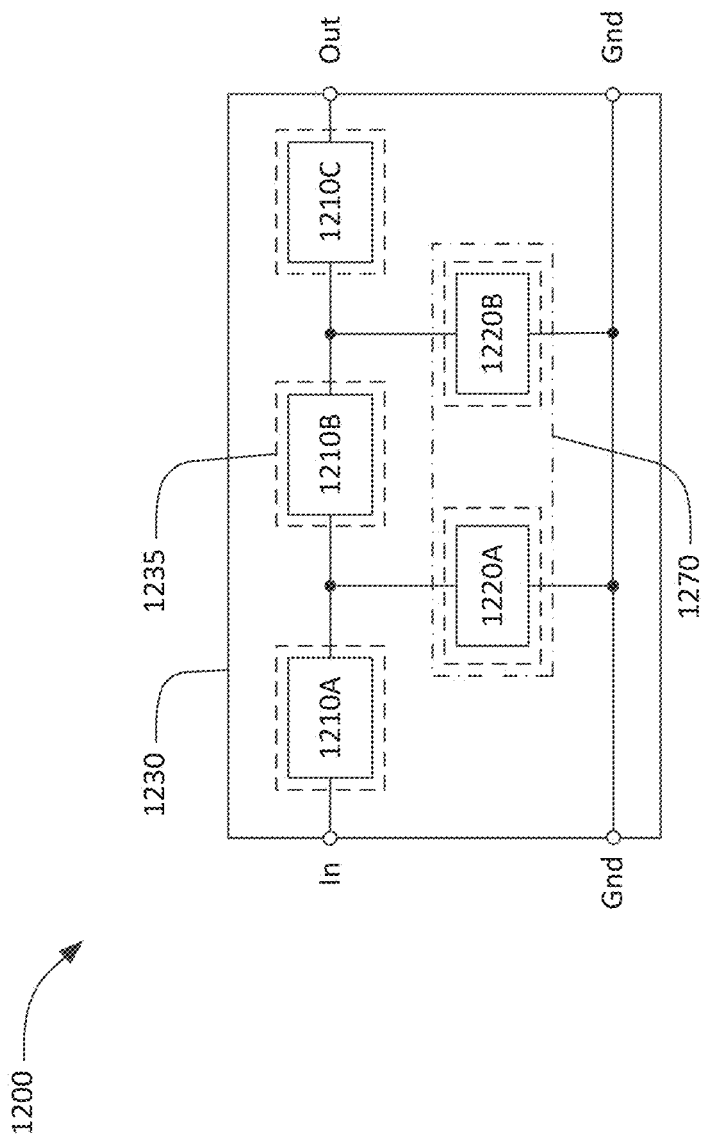
FIG. 12 is a schematic block diagram of a band-pass filter using acoustic resonators.

FIG. 12 is a schematic circuit diagram and layout for a high frequency band-pass filter 1200 using XBARs. The filter 1200 has a conventional ladder filter architecture including three series resonators 1210A, 1210B, 1210C and two shunt resonators 1220A, 1220B. The three series resonators 1210A, 1210B, and 1210C are connected in series between a first port and a second port (hence the term "series resonator"). In FIG. 12, the first and second ports are labeled "In" and "Out", respectively. However, the filter 1200 is bidirectional and either port may serve as the input or output of the filter. The two shunt resonators 1220A, 1220B are connected from nodes between the series resonators to ground. A filter may contain additional reactive components, such as capacitors and/or inductors, not shown in FIG. 12. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 1200, the three series resonators 1210A, 1210B, and 1210C and the two shunt resonators 1220A and 1220B of the filter 1200 are formed on a single plate 1230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 12, the cavities are illustrated schematically as the dashed rectangles (such as the rectangle 1235). In this example, each IDT is disposed over a respective cavity. In other filters, the IDTs of two or more resonators may be disposed over a single cavity.

Each of the resonators 1210A, 1210B, 1210C, 1220A, and 1220B in the filter 1200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 1200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a dielectric layer (also called a "frequency setting layer"), represented by the dot-dash rectangle 1270, may be formed on the front and/or back surface of the shunt resonators to set the resonance frequencies of the shunt resonators lower relative to the resonance frequencies of the series resonators. In other filters, series resonators may have thinner piezoelectric plates than shunt resonators. In some filters, the series resonators and the shunt resonators may be fabricated on separate chips having different piezoelectric plate thicknesses.

Figure 13:
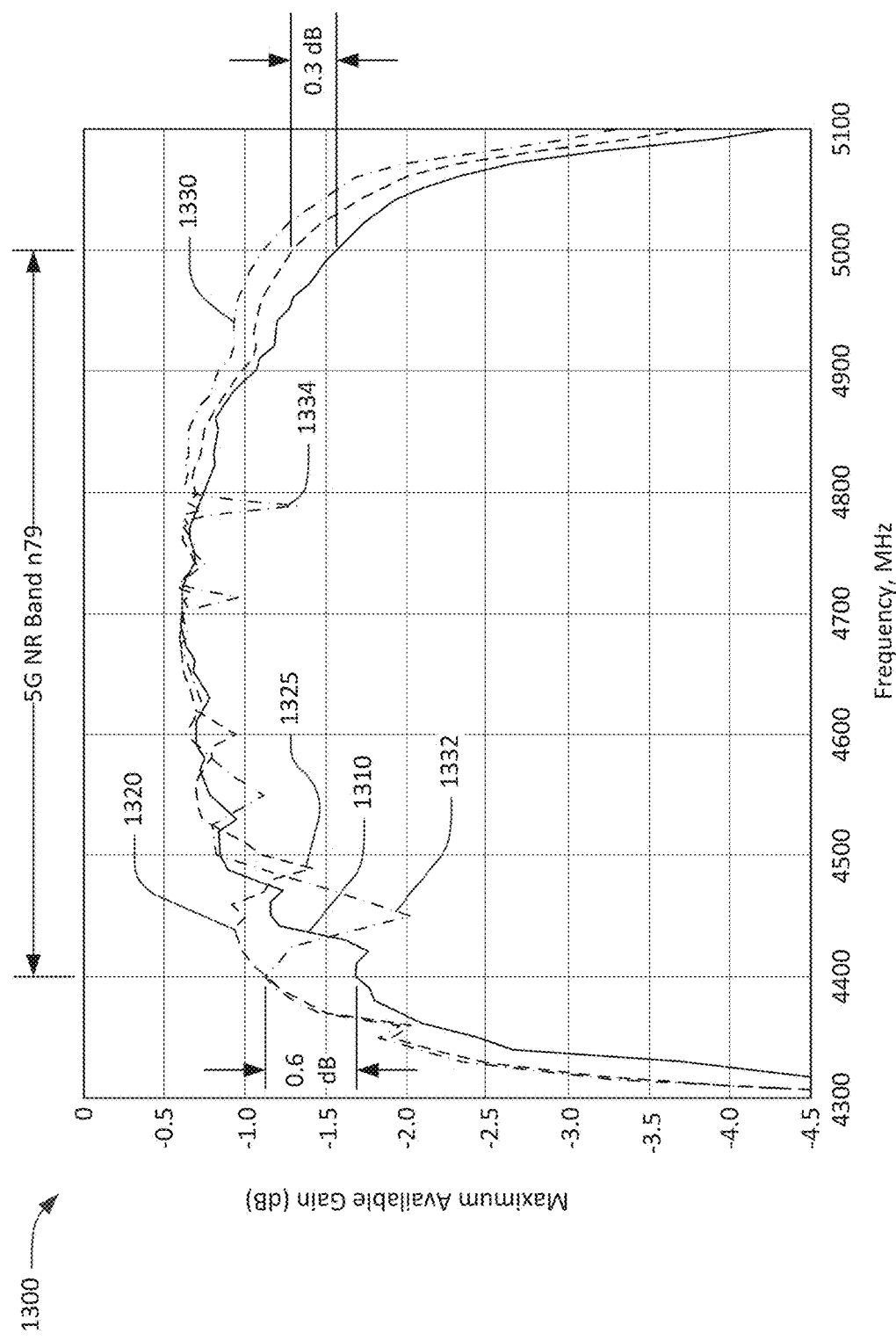
FIG. 13 is a graph comparing the performance of band-pass filters implemented using XBARs with and without acoustic confinement structures.

FIG. 13 is a graph 1300 illustrating the benefit of wide dielectric strip ACS. Specifically, the solid curve 1310 is a plot of maximum available gain of a band n79 bandpass filter including XBARs without any acoustic confinement structures. The dashed curve 1320 and the dot-dash curve 1330 are plots of maximum available gain of two similar band n79 bandpass filters including XBARs with dielectric strip acoustic confinement structures. All curves were generated from simulations of the bandpass filter using a finite element method.

The solid curve 1320 is a plot of maximum available gain of a band n79 bandpass filter with dielectric strip ACS on all resonators. The piezoelectric plate thickness may be 370 nm as in previous examples. Shunt resonators have a dielectric layer 650 that is 130 nm thick (e.g., thickness td is 500 nm) and series resonators have a dielectric layer 650 that is 30 nm thick (e.g., thickness td is 400 nm). The thickness ts of the dielectric strip ACS of every resonator is 15 nm or 0.03 td for shunt resonators and 0.0375 td for series resonators. The total width ds of the dielectric strip ACS on each resonator is individually optimized and varies between 3 um and 6 um such that 6 td<ds<16 td. In general, ds for series resonators tends to be larger than ds for shunt resonators. Comparison of the solid curve 1310 and the dashed curve 1320 shows incorporation of a dielectric strip ACS on all of the XBARs of the filter increases the maximum available gain by 0.6 dB at the lower band edge and 0.3 dB at the upper band edge.

The dot-dash curve 1330 is a plot of maximum available gain of a band n79 bandpass filter similar to the previous example with the thickness ts of the dielectric strip ACS on series resonators increased to 25 nm or 0.0625 td. Increasing the thickness of the dielectric strip ACS on the series resonators provides a further 0.2 dB of maximum available gain at the upper band edge at the expense of increasing the amplitude and number of spurs in the passband.

While the incorporation of wide dielectric strip ACS can reduce losses at the band edges of a bandpass filter, the ACS may introduce spurs or ripple within the passband of the filter, such as the spur 1325 in the dashed curve 1320 and the spurs 1332 and 1334 in the dot-dash curve 1330. Such spurs may be caused by acoustic modes that are confined to the dielectric strip ACS.

Spurs introduced by dielectric strip ACS can be minimized, if not eliminated, by varying the ACS structures within and between various resonators in the filter. For example, in the filter 1200 of FIG. 12, some or all of the resonators 1210A, 1210B, 1210C, 1220A, and 1220B may have dielectric strip ACS. A first resonator may have a dielectric strip ACS with first dimensions (i.e. dol, dg, is as defined in FIG. 5) and a second resonator may have a dielectric strip ACS with at least dimension different from the corresponding dimension of the first resonator. Changing the ACS structure between resonators spreads the spurs over a wider frequency range and thus reduces the magnitude of the spur at any specific frequency.

In addition, the dimensions of a dielectric strip ACS may be varied within a resonator. For example, FIG. 14A is a plan view of a portion of an IDT 1400A including a portion of a busbar 1432, portions of IDT fingers such as finger 1436, and a dielectric strip ACS 1454A. The width, in the aperture direction, of the dielectric strip ACS changes linearly from a minimum value $ts_{min}$ to a maximum value of $ts_{max}$. FIG. 14B is a plan view of a portion of a similar IDT 1400B where a width, in the aperture direction, of a dielectric strip ACS 1454B changes cyclically from a minimum value $ts_{min}$ to a maximum value of $ts_{max}$. While FIG. 14A and FIG. 14B illustrate the ACS width varying as a linear function of position along the length of the IDS, the ACS width may be a nonlinear function of position. The width, in the aperture direction of an ACS may vary in steps between two or more values. The steps may be aligned with or asynchronous with the IDT fingers. The ACS structure adjacent to the two busbars of an IDS may be the same or different.

In a filter with multiple XBARs, the dielectric strip ACSs of the various XBARs may be the same or different. Some or all of the XBARs may have dielectric strip ACS with different total width ds or different overlap dol with the IDT fingers. Some, all, or none of XBARs in a filter may have dielectric strip ACS that vary along the length of the respective IDTs. XBARs with dielectric strip ACS that vary along the length of the respective IDTs may vary in different manners.

Figure 15:
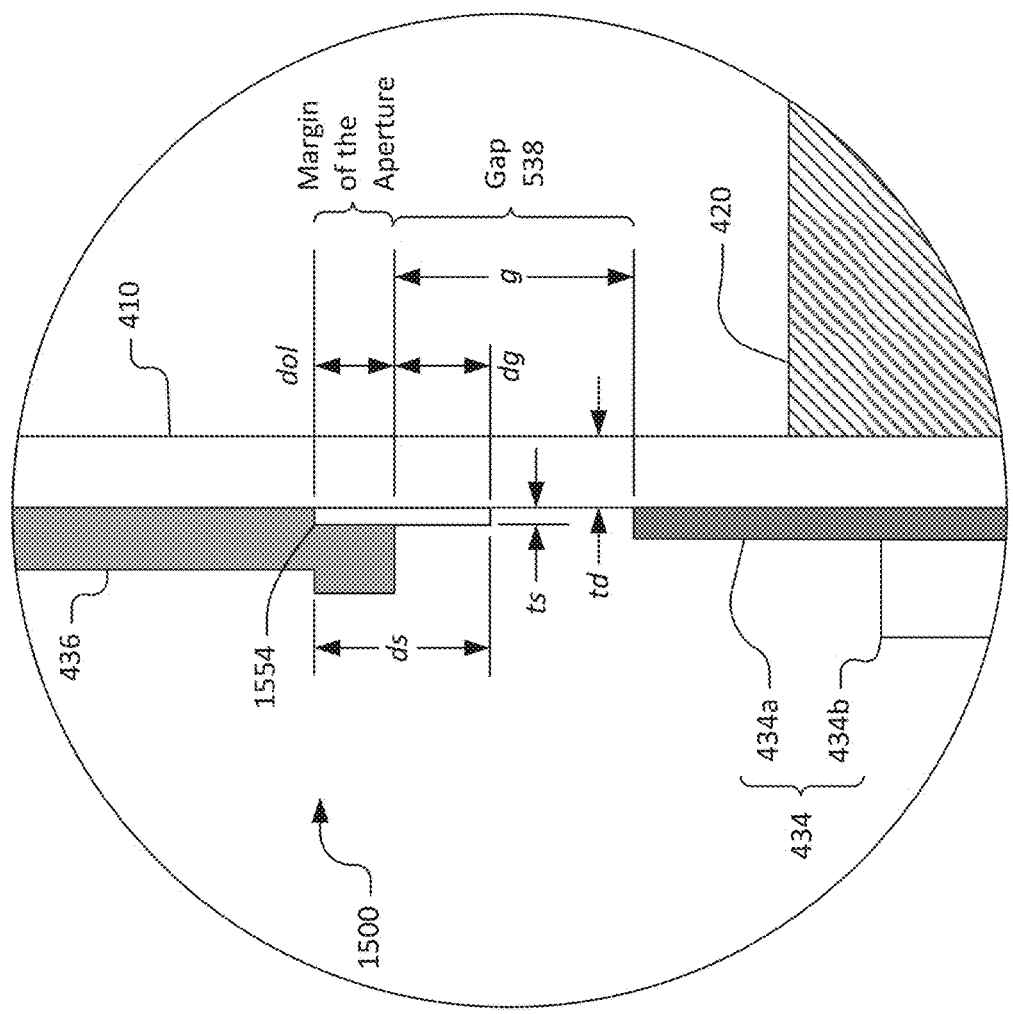
FIG. 15 is a detailed cross-sectional view of a buried acoustic confinement structure.

FIG. 15 is a detailed cross-sectional view of a portion of XBAR 1500 with another dielectric strip ACS configuration. FIG. 15 shows portions of the piezoelectric plate 410 and the substrate 420. An IDT finger 436 and a portion 434a of the second bus bar 434 are formed in a first conductor level. The bus bar 434 typically includes a second conductor level 434b. The gap 538 between the end of the IDT finger 436 and the portion of the busbar 434a has a width g.

The dielectric strip ACS 1554 is formed directly on the surface of the piezoelectric plate 410. The dielectric strip ACS 1554 has a total width of ds, of which a first portion with a width dol is under the IDT finger 436 in the margin of the aperture, which is to say between the IDT finger 436 and the piezoelectric plate 410. A second portion of the dielectric strip ACS 1554 with a width dg is disposed on the piezoelectric plate 410 in the gap 538. dg is less than g such that the second portion of the dielectric strip ACS 1554 does not span the gap 538. The thickness ts of the dielectric strip ACS may be greater than or equal to 0.008 td and less than or equal to 0.06 td. This configuration may be referred to as a "buried" dielectric strip ACS since a portion of the dielectric strip is under the IDT conductors.

Descriptions above with respect to XBARS of FIGS. 4-14 also apply to XBAR 1500. For example, XBAR 1500 may have dielectric 650 with a single or varying thickness for various resonators, such as for series and shunt resonators of FIGS. 12 and 13 as noted above. Also, the dielectric strip 1554 of XBAR 1500 may have a gap with a width dos such as noted above for FIG. 10. Also, the dielectric strip 1554 XBAR 1500 may have, in the aperture direction, a width ds or dol of the dielectric strips 1454A or 1454B that changes one of linearly or cyclically from a minimum value $ts_{min}$ to a maximum value of $ts_{max}$ such as noted for FIG. 14A-B.

In some cases, the descriptions herein, such as to XBARS and/or filters of FIGS. 1-15, apply to two, three or more than three (e.g., multiple) XBARS. They may apply to ladder filters such as filter 1200 having 5, 7, 9 to 15 XBARS; or 6, 8, 10 to 16 XBARS. For example, a filter may have two, three or more acoustic resonators each having first and second dielectric strips with a different thickness ts than the others of the two, three or more resonators. A width dol and/or ds of each of the two, three or more acoustic resonators may be different than those of the others of the two, three or more resonators. Some of the multiple XBARS may be shunt resonators and some series resonators. The shunt resonators may have a dielectric layer horizontally between the IDT fingers with a thickness different than that of the series resonators.

In some cases, at least one of the multiple XBARS is a shunt resonator and at least two are series resonators. The shunt resonator and one of the series resonators may have a same first thickness ts1; and another of the series resonators may have a second different thickness ts2. In this case, a thickness td of the piezoelectric plate may be 370 nm, a thickness of a dielectric 650 of the shunt resonator may be 130 nm thick, a thickness of a dielectric 650 of the two series resonators is 30 nm thick. Here, the first thickness ts can be 15 nm or 0.03 td for the shunt resonator, 15 nm or 0.0375 td for the first series resonator, and 25 nm or 0.0625 td for the other series resonator. In other cases, although they are different thicknesses, both ts1 and ts2 may be in a range of between 100 and 1000 nm. Also, a thickness of a dielectric 650 of the shunt resonator may be the same or different than that of the two series resonators; and those two thicknesses and a thickness td of the diaphragm of the shunt and two series resonators may be related by the equation: $0.008\ td \le ts \le 0.06\ td$. Moreover, a thickness of the IDT of the shunt resonator may be the same or different than that of the two series resonators; and those two thicknesses may be in a range of between 100 and 1000 nm.

The multiple XBARS may, in an aperture direction, each have the widths ds and/or dol that change one of linearly or cyclically from a minimum value $ts_{min}$ to a maximum value of $ts_{max}$. These changes may be different for each XBAR.

Description of Methods

Figure 16:
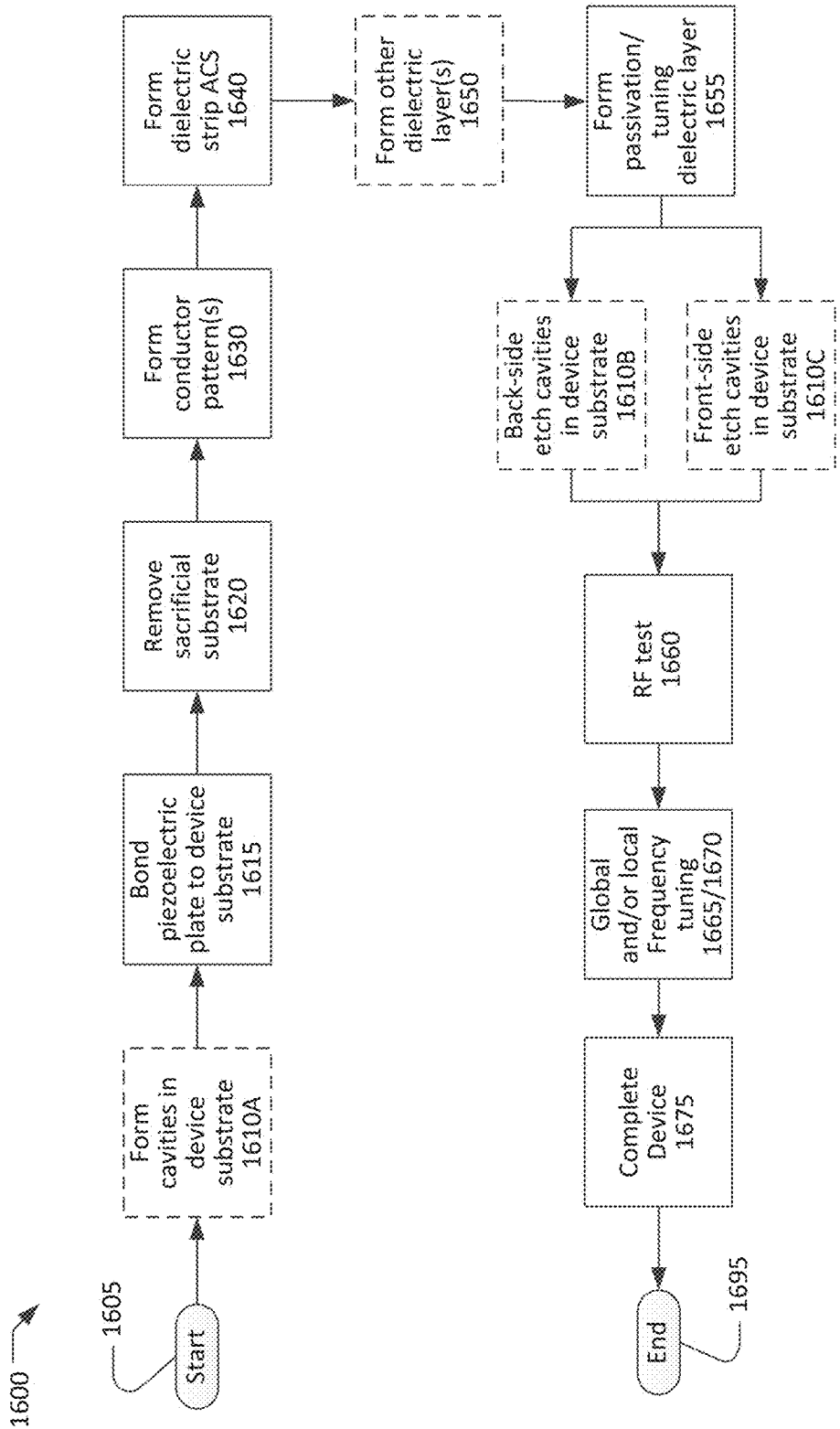
FIG. 16 is a flow chart of a method for fabricating an XBAR.

FIG. 16 is a simplified flow chart summarizing a process 1600 for fabricating a filter device incorporating XBARs with structures for reducing acoustic energy leakage. Specifically, the process 1600 is for fabricating a filter device including multiple XBARs, some of which may include a frequency setting dielectric or coating layer. The process 1600 starts at 1605 with a device substrate and a thin plate of piezoelectric material disposed on a sacrificial substrate. The process 1600 ends at 1695 with a completed filter device. The flow chart of FIG. 16 includes only major process steps. Various conventional process steps (e.g. surface preparation, cleaning, inspection, baking, annealing, monitoring, testing, etc.) may be performed before, between, after, and during the steps shown in FIG. 16.

While FIG. 16 generally describes a process for fabricating a single filter device, multiple filter devices may be fabricated simultaneously on a common wafer (consisting of a piezoelectric plate bonded to a substrate). In this case, each step of the process 1600 may be performed concurrently on all of the filter devices on the wafer.

The flow chart of FIG. 16 captures three variations of the process 1600 for making an XBAR which differ in when and how cavities are formed in the device substrate. The cavities may be formed at steps 1610A, 1610B, or 1610C. Only one of these steps is performed in each of the three variations of the process 1600.

The piezoelectric plate may typically be ZY-cut lithium niobate. The piezoelectric plate may be some other material and/or some other cut. The device substrate may preferably be silicon. The device substrate may be some other material that allows formation of deep cavities by etching or other processing.

In one variation of the process 1600, one or more cavities are formed in the device substrate at 1610A, before the piezoelectric plate is bonded to the substrate at 1615. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using conventional photolithographic and etching techniques. Typically, the cavities formed at 1610A will not penetrate through the device substrate.

At 1615, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 1620, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1620, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs of each XBAR, is formed at 1630 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1630 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1630 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1640, dielectric strip ACS may be formed. As previously described, the dielectric strip ACS may overlap the ends of the IDT fingers in the margins of the aperture and extend into the gaps between the ends of the IDT fingers and adjacent busbars. The dielectric strip ACS may be formed by depositing and patterning, using either etching or a lift-off technique, a dielectric thin film. The dielectric strip ACS may be silicon dioxide, silicon nitride, aluminum oxide, or some other dielectric material. The dielectric strip ACS may be multiple layers of different materials or a mixture of two or more materials. Step 1640, may be repeated to form multiple dielectric strips ACS overlapping the ends of the IDT fingers for multiple resonators where the dielectric strips in the two margins of each resonator has a different thickness than the thickness for any other of the multiple resonators.

When a buried dielectric strip ACS is used, as shown in FIG. 15, the actions at 1640 are performed before forming the conductor patterns at 1630.

At 1650, one or more frequency setting dielectric layer(s) may optionally be formed by depositing one or more layers of dielectric material on the front side of the piezoelectric plate. For example, a dielectric layer may be formed over the shunt resonators to lower the frequencies of the shunt resonators relative to the frequencies of the series resonators.

The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators. The formation of one or more frequency setting layers at 1650 may be performed before or after (as shown) the formation of the dielectric strip ACS at 1640.

At 1655, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1600, the passivation/tuning dielectric layer may be formed after the cavities in the device substrate are etched at either 1610B or 1610C.

In a second variation of the process 1600, one or more cavities are formed in the back side of the device substrate at 1610B. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 1600, one or more cavities in the form of recesses in the device substrate may be formed at 1610C by etching the substrate using an etchant introduced through openings in the piezoelectric plate. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities formed at 1610C will not penetrate through the device substrate.

Ideally, after the cavities are formed at 1610B or 1610C, most or all of the filter devices on a wafer will meet a set of performance requirements. However, normal process tolerances will result in variations in parameters such as the thicknesses of dielectric layer formed at 1650 and 1655, variations in the thickness and line widths of conductors and IDT fingers formed at 1630, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1655. The frequency of a filter device passband can be lowered by adding material to the passivation/tuning layer, and the frequency of the filter device passband can be increased by removing material to the passivation/tuning layer. Typically, the process 1600 is biased to produce filter devices with passbands that are initially lower than a required frequency range but can be tuned to the desired frequency range by removing material from the surface of the passivation/tuning layer.

At 1660, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1665, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1660 may be processed to generate a global contour map indicating the amount of material to be removed as a function of two-dimensional position on the wafer. The material is then removed in accordance with the contour map using the selective material removal tool.

At 1670, local frequency tuning may be performed in addition to, or instead of, the global frequency tuning performed at 1665. "Local" frequency tuning is performed with a spatial resolution smaller than an individual filter device. The test results from 1660 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1665 and/or 1670, the filter device is completed at 1675. Actions that may occur at 1675 include forming bonding pads or solder bumps or other means for making connection between the device and external circuitry (if such pads were not formed at 1630); excising individual filter devices from a wafer containing multiple filter devices; other packaging steps; and additional testing. After each filter device is completed, the process ends at 1695.

In some cases, the descriptions of process 1600, such as to form XBARS and/or filters, apply to two, three or more than three (e.g., multiple) XBARS as noted above for FIGS. 1-15.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter comprising three or more acoustic resonators including:
   a substrate;
   a piezoelectric layer supported by the substrate;
   a diaphragm comprising a respective portion of the piezoelectric layer that is over a cavity; and
   a conductor pattern on the piezoelectric layer, the conductor pattern comprising an interdigital transducer (IDT) having first and second sets of interleaved fingers extending from first and second busbars, respectively,
   wherein overlapping portions of the interleaved fingers define an aperture of the respective acoustic resonator,
   wherein each of the three or more acoustic resonators further comprises:
      a first dielectric strip that overlaps the interleaved fingers in a first margin of the aperture and extends into a first gap between the first margin and the first busbar; and
      a second dielectric strip that overlaps the interleaved fingers in a second margin of the aperture and extends into a second gap between the second margin and the second busbar, and
         wherein a thickness ts of each of the first and second dielectric strips of a first acoustic resonator of the three or more acoustic resonators is different than a thickness ts of each of the first and second dielectric strips of a second and a third acoustic resonator of the three or more acoustic resonators.

2. The filter of claim 1, wherein the thickness ts of each of the first and second dielectric strips of the second acoustic resonator of the three or more acoustic resonators is different than the thickness ts of each of the first and second dielectric strips of the third acoustic resonator of the three or more acoustic resonators.

3. The filter of claim 2, wherein the piezoelectric layer is one of Z-cut lithium niobate and Z-cut lithium tantalate, and wherein the first acoustic resonator of the three or more acoustic resonators is a shunt resonator and the second and third acoustic resonators of the three or more acoustic resonators are series resonators.

4. The filter of claim 3, wherein:
   each of the first and second dielectric strips of the first and second acoustic resonators has a first thickness ts1; and
   each of the first and second dielectric strips of the third acoustic resonator has a second different thickness ts2.

5. The filter of claim 4, wherein:
   a thickness td of the piezoelectric layer is 370 nm;
   a thickness of a dielectric horizontally between fingers of the first acoustic resonator is 130 nm thick;
   a thickness of a dielectric horizontally between fingers of the second and third acoustic resonators is 30 nm thick;
   the first thickness ts1 is 15 nm or 0.03 td for the first acoustic resonator;
   the first thickness ts1 is 15 nm or 0.0375 td for the second acoustic resonator; and
   the first thickness ts1 is 25 nm or 0.0625 td for the third acoustic resonator.

6. The filter of claim 1, wherein each of the first and second dielectric strips extend over an entire length of the IDT of each of the three or more acoustic resonators; wherein at least one of a width ds of each of the first and second dielectric strips, or a width dol of each of the first and second margins of the aperture varies along a length of the IDT of each acoustic resonator; and wherein, in an aperture direction, the width ds or dol changes one of linearly or cyclically from a minimum value $ts_{min}$ to a maximum value of $ts_{max}$.

7. A filter comprising:
   a substrate;
   a piezoelectric layer supported by the substrate;
   three or more diaphragms, each diaphragm comprising a respective portion of the piezoelectric layer that is over a cavity; and
   a conductor pattern on a front surface of the piezoelectric layer, the conductor pattern comprising interdigital transducers (IDTs) of three or more acoustic resonators, each IDT comprising first and second sets of interleaved fingers extending from first and second busbars respectively,
   wherein;
      the interleaved fingers extend onto a respective diaphragm of the three or more diaphragms, and
      overlapping portions of the interleaved fingers define an aperture of the respective acoustic resonator;
   wherein at least one of the three or more acoustic resonators further comprises:
      a first dielectric strip on the front surface of the piezoelectric layer, a first portion of the first dielectric strip under the IDT fingers in a first margin of the aperture and a second portion of the first dielectric strip extending into a first gap between the first margin and the first busbar; and
      a second dielectric strip on the front surface of the piezoelectric layer, a first portion of the second dielectric strip under the IDT fingers in a second margin of the aperture and a second portion of the second dielectric strip extending into a second gap between the second margin and the second busbar.

8. The filter of claim 7, wherein each of the three or more acoustic resonators further comprises the first and second dielectric strip; wherein a thickness ts of each of the first and second dielectric strips of a first acoustic resonator of the three or more acoustic resonators is different than a thickness ts of each of the first and second dielectric strips of a second and a third acoustic resonator of the three or more acoustic resonators; and wherein a thickness ts of each of the first and second dielectric strips of the second acoustic resonator of the three or more acoustic resonators is different than a thickness ts of each of the first and second dielectric strips of the third acoustic resonator of the three or more acoustic resonators.

9. The filter of claim 8, wherein the piezoelectric layer is one of Z-cut lithium niobate and Z-cut lithium tantalate, and wherein the first acoustic resonator of the three or more acoustic resonators is a shunt resonator and the second and third acoustic resonator of the three or more acoustic resonators are series resonators.

10. The filter of claim 9, wherein:
    each of the three or more acoustic resonators further comprises the first and second dielectric strip;

each of the first and second dielectric strips of the first and second acoustic resonators has a first thickness ts1; and
each of the first and second dielectric strips of the third acoustic resonator has a second different thickness ts2.

11. The filter of claim 10, wherein:
a thickness td of the piezoelectric layer is 370 nm;
a thickness of a dielectric horizontally between fingers of the first acoustic resonator is 130 nm thick;
a thickness of a dielectric horizontally between fingers of the second and third acoustic resonators is 30 nm thick;
the first thickness ts1 is 15 nm or 0.03 td for the first acoustic resonator;
the first thickness ts1 is 15 nm or 0.0375 td for the second acoustic resonator; and
the first thickness ts1 is 25 nm or 0.0625 td for the third acoustic resonator.

12. The filter of claim 7, wherein each of the three or more acoustic resonators further comprises the first and second dielectric strip; wherein each of the first and second dielectric strips extend over an entire length of the IDT of each acoustic resonator of the three or more acoustic resonators; wherein at least one of a width ds of each of the first and second dielectric strips, or a width dol of each of the first and second margins of the aperture varies along a length off the IDT of each acoustic resonator; and wherein in an aperture direction, the width ds or dol changes one of linearly or cyclically from a minimum value $ts_{min}$ to a maximum value of $ts_{max}$.

13. A filter comprising:
three or more acoustic resonators, each of the three or more acoustic resonators including:
a substrate;
a piezoelectric layer supported by the substrate and that includes a diaphragm that is over a cavity; and
a conductor pattern on the piezoelectric layer, the conductor pattern comprising an interdigital transducer (IDT) having first and second sets of interleaved fingers extending from first and second busbars, respectively,
wherein overlapping portions of the interleaved fingers define an aperture of the respective acoustic resonator,
wherein at least one acoustic resonator of the three or more acoustic resonators further comprises:
a first dielectric strip that overlaps the interleaved fingers in a first margin of the aperture and extends into a first gap between the first margin and the first busbar; and
a second dielectric strip that overlaps the interleaved fingers in a second margin of the aperture and extends into a second gap between the second margin and the second busbar, and
wherein each of the first and second dielectric strips extend over an entire length of the IDT of the at least one acoustic resonator, and at least one of a width ds of each of the first and second dielectric strips or a width dol of each of the first and second margins of the aperture varies along a length of the IDT of the at least one acoustic resonator.

14. The filter of claim 13, wherein, in an aperture direction, the width ds or the width dol changes one of linearly or cyclically from a minimum value $ts_{min}$ to a maximum value of $ts_{max}$.

15. The filter of claim 13, wherein each of the three or more acoustic resonators further comprises the first and second dielectric strip, and a thickness ts of each of the first and second dielectric strips of a first acoustic of the three or more acoustic resonators is different than a thickness ts of each of the first and second dielectric strips of a second and a third acoustic resonator of the three or more acoustic resonators.

16. The filter of claim 15, wherein the thickness ts of each of the first and second dielectric strips of the second acoustic resonator of the three or more acoustic resonators is different than the thickness ts of each of the first and second dielectric strips of the third acoustic resonator of the three or more acoustic resonators.

17. The filter of claim 13, wherein the piezoelectric layer is one of Z-cut lithium niobate and Z-cut lithium tantalate, and wherein a first acoustic resonator of the three or more acoustic resonators is a shunt resonator and a second and third acoustic resonators of the three or more acoustic resonators are series resonators.

18. The filter of claim 17, wherein:
each of the first and second dielectric strips of the first and second acoustic resonators has a first thickness ts1; and
each of the first and second dielectric strips of the third acoustic resonator has a second different thickness ts2.

19. The filter of claim 18, wherein:
a thickness td of the piezoelectric layer is 370 nm;
a thickness of a dielectric horizontally between fingers of the first acoustic resonator is 130 nm thick;
a thickness of a dielectric horizontally between fingers of the second and third acoustic resonators is 30 nm thick;
the first thickness ts1 is 15 nm or 0.03 td for the first acoustic resonator;
the first thickness ts1 is 15 nm or 0.0375 td for the second acoustic resonator; and
the first thickness ts1 is 25 nm or 0.0625 td for the third acoustic resonator.

* * * * *